(12) United States Patent
Mouli

(10) Patent No.: US 7,279,764 B2
(45) Date of Patent: Oct. 9, 2007

(54) SILICON-BASED RESONANT CAVITY PHOTODIODE FOR IMAGE SENSORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/856,935

(22) Filed: Jun. 1, 2004

(65) Prior Publication Data

US 2005/0263805 A1     Dec. 1, 2005

(51) Int. Cl.
*H01L 31/0288*    (2006.01)
*H01L 31/0352*    (2006.01)
*H01L 31/0368*    (2006.01)

(52) U.S. Cl. .............................. 257/436; 257/E31.014; 257/E31.038; 257/E31.044

(58) Field of Classification Search ........ 257/290–292, 257/448, 461, 462, 465, 466, 431, 436, E31.014, 257/E31.038, E31.044; 438/48, 70
See application file for complete search history.

(56) References Cited

U.S. PATENT DOCUMENTS

| | | | | |
|---|---|---|---|---|
| 5,239,193 A | * | 8/1993 | Benton et al. ............... | 257/292 |
| 5,577,064 A | * | 11/1996 | Swirhun et al. ............... | 372/96 |
| 5,606,572 A | * | 2/1997 | Swirhun et al. ............... | 372/96 |
| 6,118,142 A | * | 9/2000 | Chen et al. ................... | 257/232 |
| 6,232,626 B1 | * | 5/2001 | Rhodes ........................ | 257/292 |
| 6,465,846 B1 | * | 10/2002 | Osanai ........................ | 257/347 |
| 2003/0053044 A1 | * | 3/2003 | Popovic et al. .............. | 356/218 |
| 2004/0042707 A1 | * | 3/2004 | Imai et al. .................... | 385/14 |
| 2004/0061126 A1 | * | 4/2004 | Imai et al. .................... | 257/113 |
| 2005/0082463 A1 | * | 4/2005 | Koyama et al. ......... | 250/214 R |

OTHER PUBLICATIONS

Sinnis et al. "Silicon-based resonant-cavity-enhanced photodiode with a buried SiO2 reflector", Applied Physics Letters, vol. 74, No. 9, Mar. 1, 1999, pp. 1203-1205.*
V. S. Sinnis et al.—"Silicon-based resonant-cavity-enhanced photodiode with a buried $SiO_2$ reflector," Applied Physics Letters, vol. 74, No. 9, Mar. 1, 1999, pp. 1203-1205.

* cited by examiner

*Primary Examiner*—Richard T. Elms
*Assistant Examiner*—Andrew O. Arena
(74) *Attorney, Agent, or Firm*—Dickstein Shapiro LLP

(57) ABSTRACT

An imager with pixels having a resonant-cavity photodiode. The resonant cavity photodiode increases absorption of light having long wavelengths. A trench is formed for the photodiode and reflective film is grown on the bottom of the trench. The reflective film reflects light that is not initially absorbed back to the active region of the photodiode.

14 Claims, 20 Drawing Sheets

SILICON-BASED RESONANT CAVITY PHOTODIODE FOR IMAGE SENSORS

FIELD OF THE INVENTION

The present invention relates to the field of semiconductor devices, particularly to an imager pixel with improved quantum efficiency and reduced cross talk.

BACKGROUND OF THE INVENTION

Typically, a digital imager array includes a focal plane array of pixel cells, each one of the cells including a photoconversion device such as, e.g., a photogate, photoconductor, or a photodiode. In a complementary metal oxide semiconductor (CMOS) imager a readout circuit is connected to each pixel cell which typically includes a source follower output transistor. The photoconversion device converts photons to electrons which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is a voltage output on a column line when a row select transistor for the row containing the pixel is activated.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, assigned to Micron Technology, Inc. The disclosures of each of the forgoing patents are herein incorporated by reference in their entirety.

In a typical digital CMOS imager pixel (FIG. 1), when incident light strikes the surface of a photodiode 49, electron/hole pairs are generated in the p-n junction (between regions 21 and 23) of the photodiode 49. The generated electrons are collected in the n-type region 23 of the photodiode 49. The photo charge moves from the initial charge accumulation region to a charge collection region 16, typically a floating diffusion region, or it may be transferred to the floating diffusion region via a transfer transistor 26. The charge at the floating diffusion region 16 is typically converted to a pixel output voltage by a source follower transistor (not shown).

Band gap refers to the energy levels separating valence bands and conductive bands. Different materials may have indirect or direct band gap characteristics. For example, silicon has indirect band gap characteristics. Due to the presence of the indirect band gap in silicon, photons have long absorption lengths in silicon compared to direct band gap materials like GaAs or InP. At infrared wavelengths (700 nm), silicon has an absorption coefficient of $3 \times 10^3$ $cm^{-1}$, which corresponds to an absorption length of slightly more than 3.0 μm. This necessitates a very large photodiode thickness in order to obtain a reasonable response. A large photodiode, however, results in poor bandwidth due to large transit times needed for carrier collection.

In the conventional pixel of FIG. 1, a large amount of incident light of longer wavelengths are not absorbed by the photodiode 49, leading to decreased quantum efficiency of the pixel. Infrared light, for example, has a long wavelength and penetrates deep into a pixel cell. Infrared light sensors typically have a high aspect ratio (depth relative to width) and increased cross talk (i.e., where charge carriers from one pixel travel to adjacent pixels). In addition, photons may be lost due to recombination in the substrate and/or photons may collect in the contact to the substrate. If the photons travel under the STI region 55 (FIG. 1), they may affect adjacent pixels, also creating cross talk.

Fabry-Perot resonant cavities have been used in other systems, such as lasers, to build up large field intensities at specified resonant frequencies and to act as spatial and frequency filters. In a resonant cavity, a pair of parallel polished planes act like mirrors to create resonance. What is needed, is an imager that can capture longer wavelengths of light (e.g., 650-750 nm or longer) with improved quantum efficiency and without increased cross talk, using a resonant cavity.

SUMMARY

Embodiments of the invention provide an imager pixel comprising a reflective layer formed within a photoconversion device. The photoconversion device is formed within a trench of the pixel's substrate. The reflective layer serves to reflect incident light, not initially absorbed, back up toward the surface of the photoconversion device so that it can be efficiently transferred as charge to a charge collection region. The quantum efficiency of the pixel is thereby improved. Cross talk can be reduced in such a structure due to improved optical and electrical isolation between adjacent pixels.

DESCRIPTION OF THE DRAWINGS

The above and other features and advantages of the invention will be more readily understood from the following detailed description which is provided in connection with the accompanying drawings, in which.

DETAILED DESCRIPTION OF THE INVENTION

Figure 1:
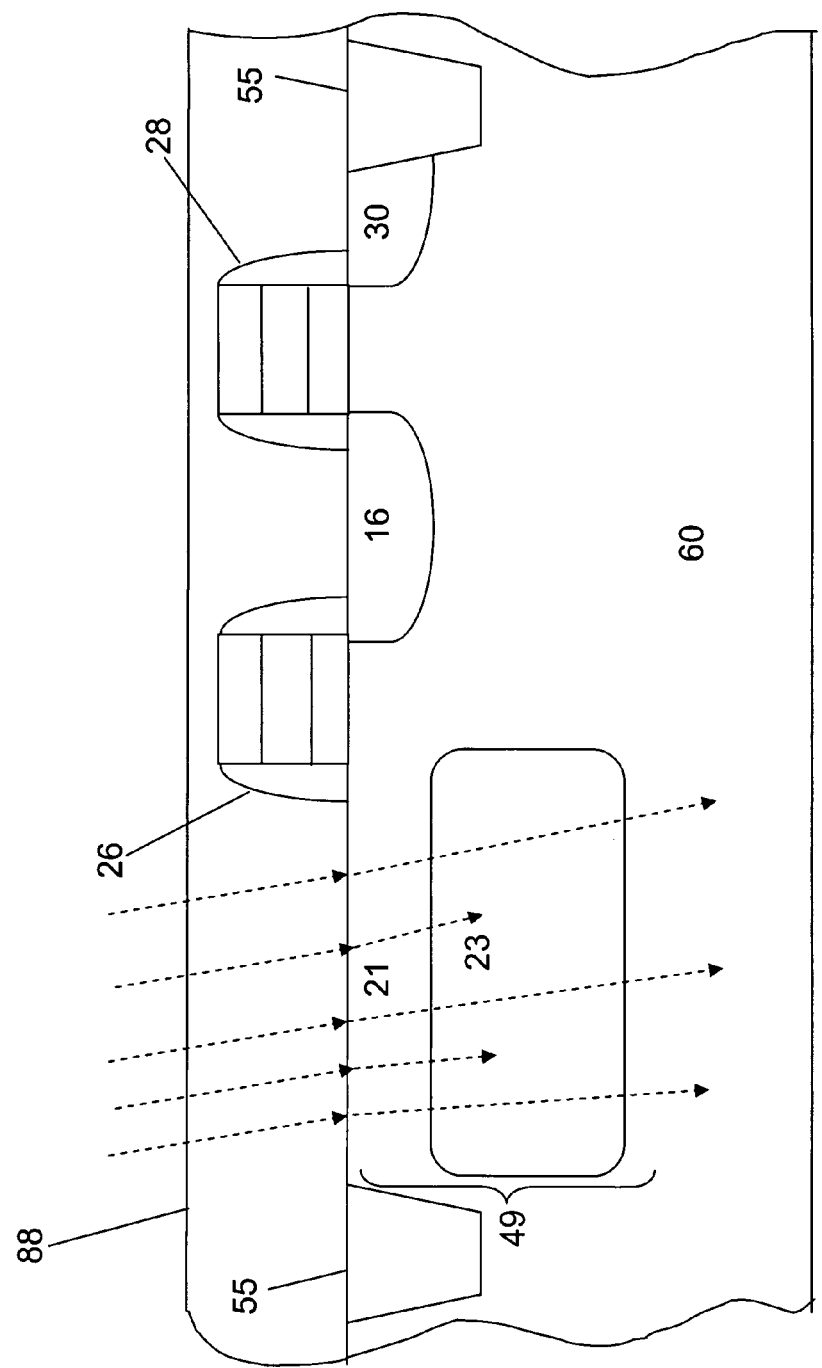
FIG. 1 is a cross-sectional view of a conventional imager pixel.

In the following detailed description, reference is made to the accompanying drawings, which form a part hereof and show by way of illustration specific exemplary embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transistors for converting photons to an electrical signal. The pixels discussed herein are illustrated and described as inventive modifications to four transistor (4T) pixel circuits for the sake of example only. It should be understood that the invention may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense.

According to the invention, a resonant cavity is created in a pixel to increase its quantum efficiency, improve absorption of long wavelength photons, improve collection of carriers, minimize carrier generation in neutral regions, remove slow carrier diffusion and reduce cross talk. At 720 nm wavelengths, there is a significant difference between the refractive index of silicon and the index of silicon dioxide films (i.e., $n_{Si}$=3.8; $n_{SiO2}$=1.47 at $\lambda$=720 nm). Trench depth can be tailored to meet the needs of quantum efficiency and dark currents. According to the invention, an oxide film at the bottom of the trench acts like a mirror to create resonance (described below).

Figure 2:
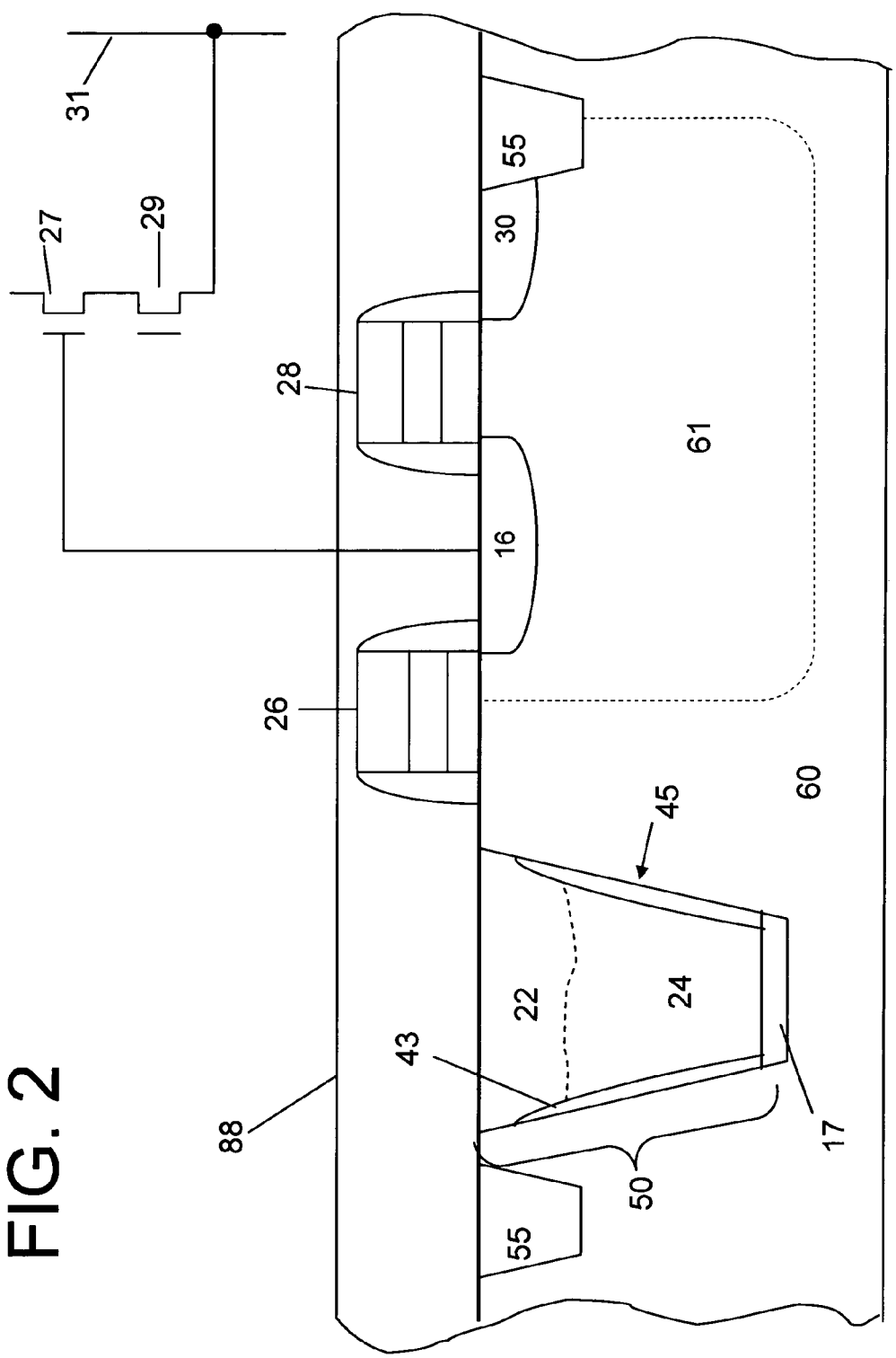
FIG. 2 is a cross-sectional view of an imager pixel constructed according to an embodiment of the invention.

Now referring to the figures, where like reference numbers designate like elements, FIG. 2 depicts a pixel according to an exemplary embodiment of the invention. A photoconversion device 50 is formed in a substrate 60 having a doped layer or well 61, which for exemplary purposes is a more heavily doped p-type well. The photoconversion device 50 is illustratively a photodiode and may be a p-n junction photodiode, a Schottky photodiode, or any other suitable photoconversion device.

The exemplary photodiode 50, as shown in FIG. 2, consists of an n-type region 22 and a p-type region 24, where photodiode 50 is located within a trench 45 formed in substrate 60. The trench 45 has a reflective layer 17 on its bottom surface. The walls of trench 45 are lined with a spacer or sidewall 43. There is a slope on sidewall 43 to allow electrical connection to a transfer transistor gate 26, in the case of a four transistor pixel as shown in FIG. 2, or to a reset transistor gate, in the case of a three transistor pixel. The slope is formed by removing about 200 Å to about 500 Å from the top of sidewall 43. The photodiode 50 is adjacent to an isolation region 55, which is illustratively a shallow trench isolation (STI) region. A floating diffusion region 16 is also formed in the substrate. Between the photodiode 50 and the floating diffusion region 16 is a transfer transistor 26 formed over the substrate, which operates to transfer charge from the photodiode 50 to the floating diffusion region 16.

The remaining structures shown in FIG. 2 include a reset transistor with associated gate 28 formed over the substrate, adjacent the floating diffusion region 16. A source follower transistor 27 and row select transistor 29 with associated gates are also included in the pixel sensor cell but are not shown as cross-sections. They are instead depicted in electrical schematic form with the output of the row select transistor 29 being connected to a column line 31. Although shown in FIG. 2 as a four-transistor (4T) configuration with a transfer transistor 26, the invention can also be utilized in a three-transistor (3T) configuration, without a transfer transistor 26, and in pixels with other transistor number configurations (e.g., 2T, 5T, 6T, 7T, etc).

FIGS. 3-14 show one exemplary method of forming a pixel sensor cell according to the invention, such as the cell illustrated in FIG. 2, at various stages of formation. For convenience, the same cross-sectional view of FIG. 2 is utilized in FIGS. 3-18 for the ensuing description, and the source follower and row select transistors are not illustrated.

Figure 3:
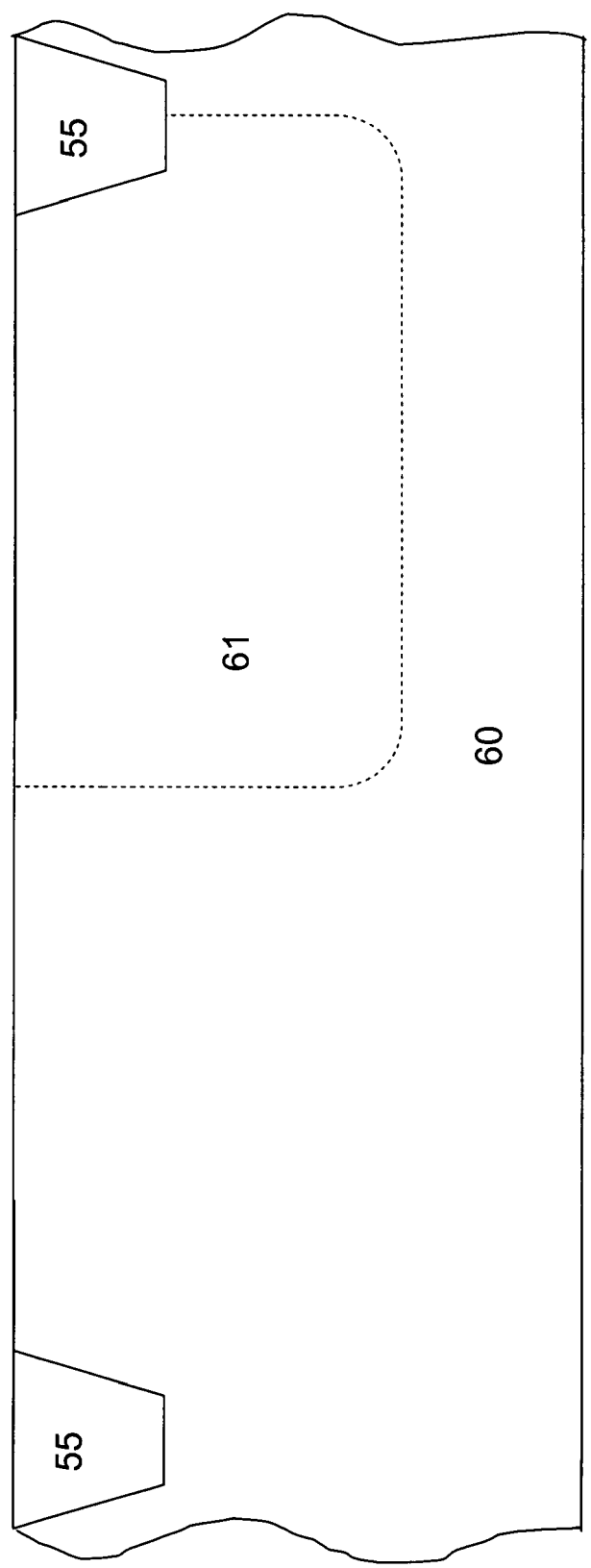
FIG. 3 is a cross-sectional view of a portion of the FIG. 2 pixel at an initial stage of fabrication.

FIG. 3 illustrates a substrate 60, which is a p-type silicon substrate, that contains a separate p-well 61 formed therein. The p-well 61 may be formed before or after the formation of isolation regions 55. The p-well implant may be conducted so that the pixel array well 61 and a p-type periphery logic well (not shown), which will contain logic circuits for controlling the pixel array, have different doping profiles. As known in the art, multiple high energy implants may be used to tailor the profile and position of the p-type well 61.

The isolation regions 55 are formed to electrically isolate regions of the substrate 60 where pixel cells will later be formed. The isolation regions 55 can be formed by any technique such as thermal oxidation of the underlying silicon in a LOCOS process, or by etching trenches and filling them with oxide in an STI (shallow trench isolation) process. Following the formation of the isolation regions 55, if the p-type well 61 has not yet been formed, it may then be formed by blanket implantation or by masked implantation.

Figure 4:
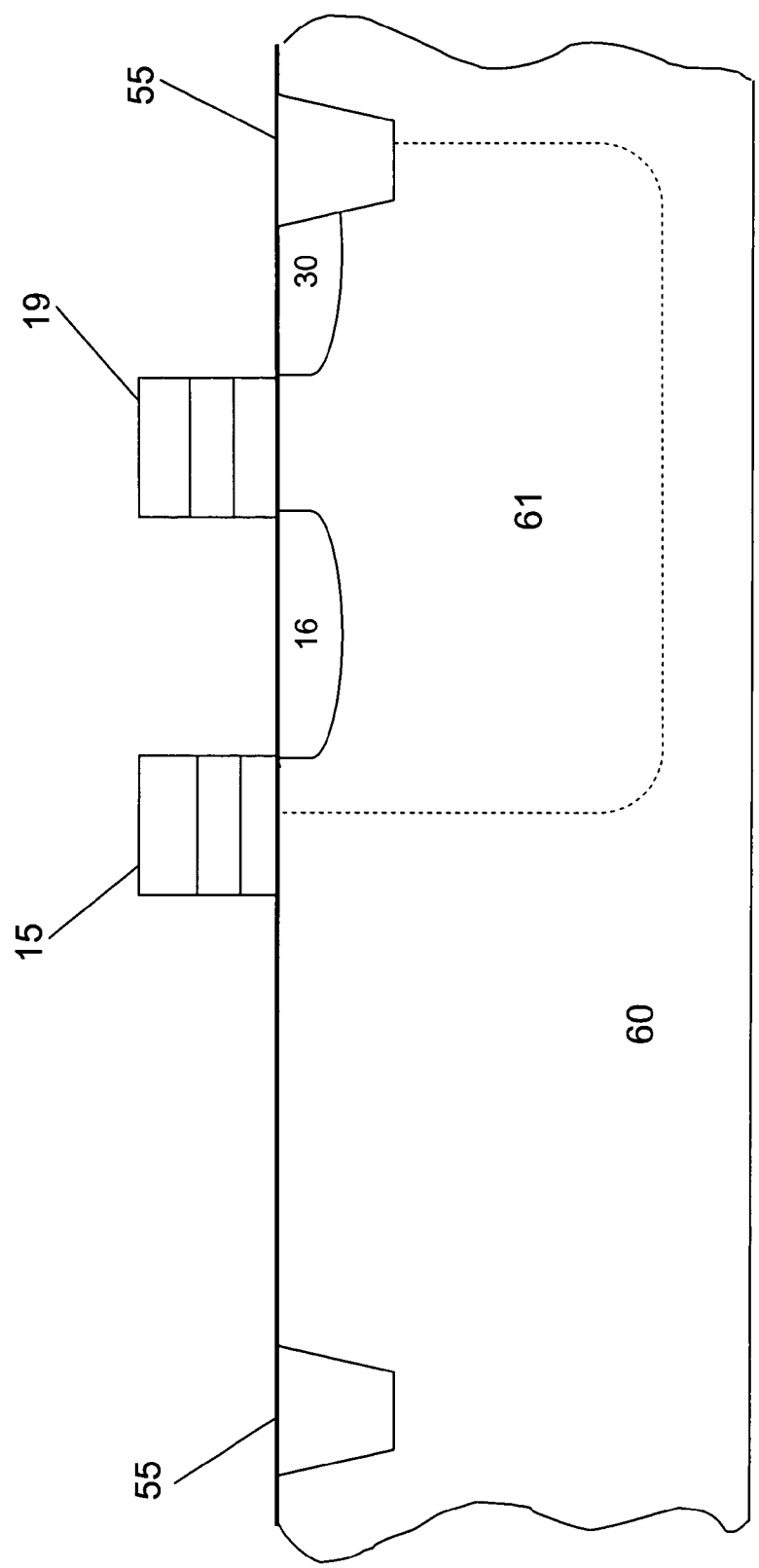
FIGS. 4-14 are cross-sectional views of the FIG. 2 pixel at intermediate stages of fabrication.

Referring to FIG. 4, a transfer gate stack 15 and reset gate stack 19 are formed by well-known methods, e.g., blanket deposition of gate oxide, doped polysilicon, deposition of metal for a silicide, deposition of nitride cap layer and annealing to form a silicide, patterning and etching. The invention is not limited to a particular method of forming transistor gate stacks 15, 19. If it is desirable for the pixel to be a 3T pixel, gate stack 15 would not be formed. A source/drain region 30 and a floating diffusion region 16 are also formed at this time, by methods known in the art. According to an embodiment of the invention, the source/drain region 30 and floating diffusion region 16 are n-type doped.

Figure 5:
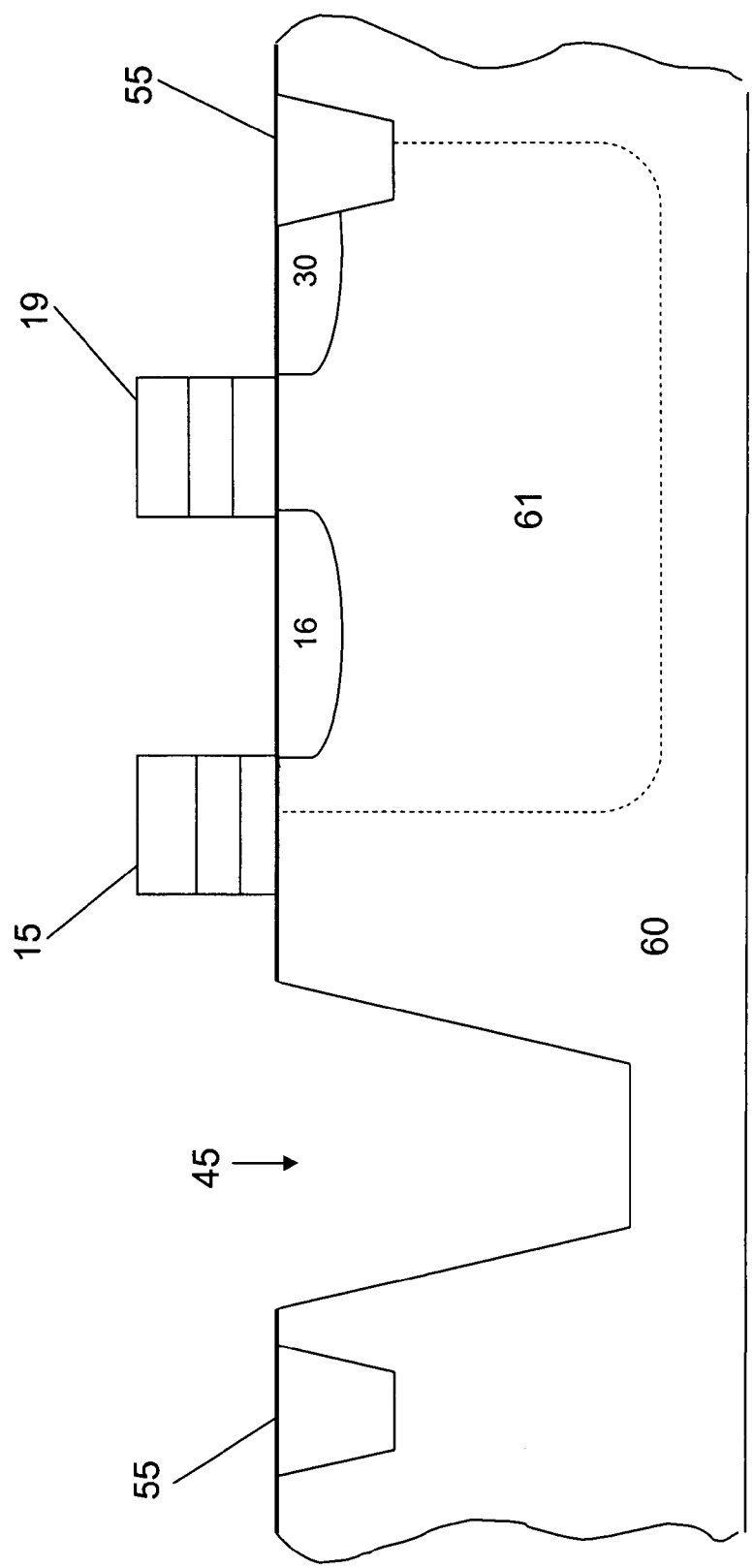

FIG. 5 depicts the formation of a trench 45 in the substrate 60 in the area adjacent the transfer transistor gate stack 15. The trench 45 can be formed by any method known in the art (see e.g., Rhodes, U.S. Pat. No. 6,232,626 incorporated herein by reference) and is formed to a depth of about 0.5 μm to about 10 μm. The trench depth depends to some extent on the wavelengths of interest. For example, a depth of 0.5 µm may be suitable for UV or blue region wavelengths, while 10 µm may be more suitable for longer wavelengths, e.g., red or infrared regions.

Figure 6:
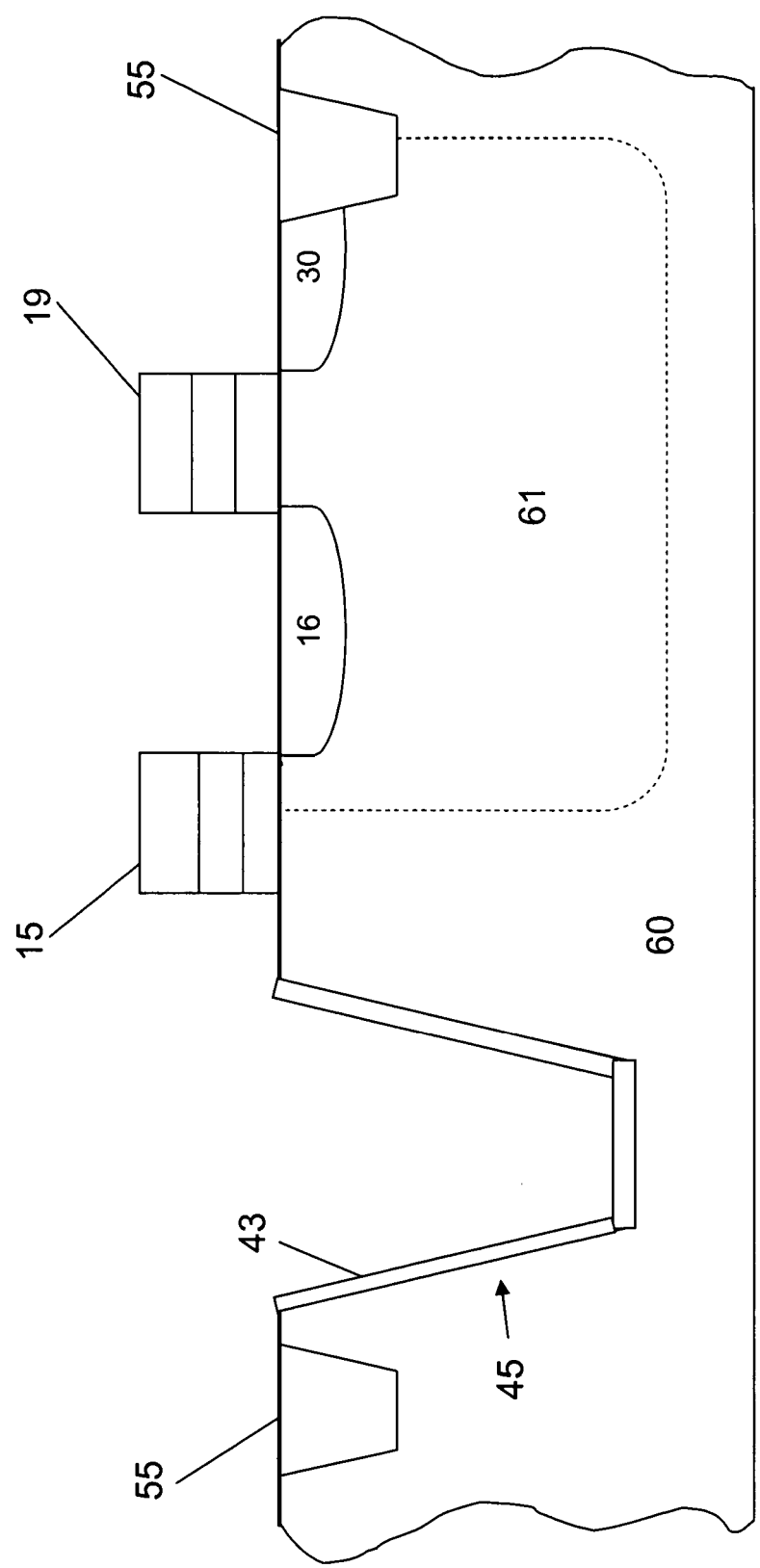
Figure 7:
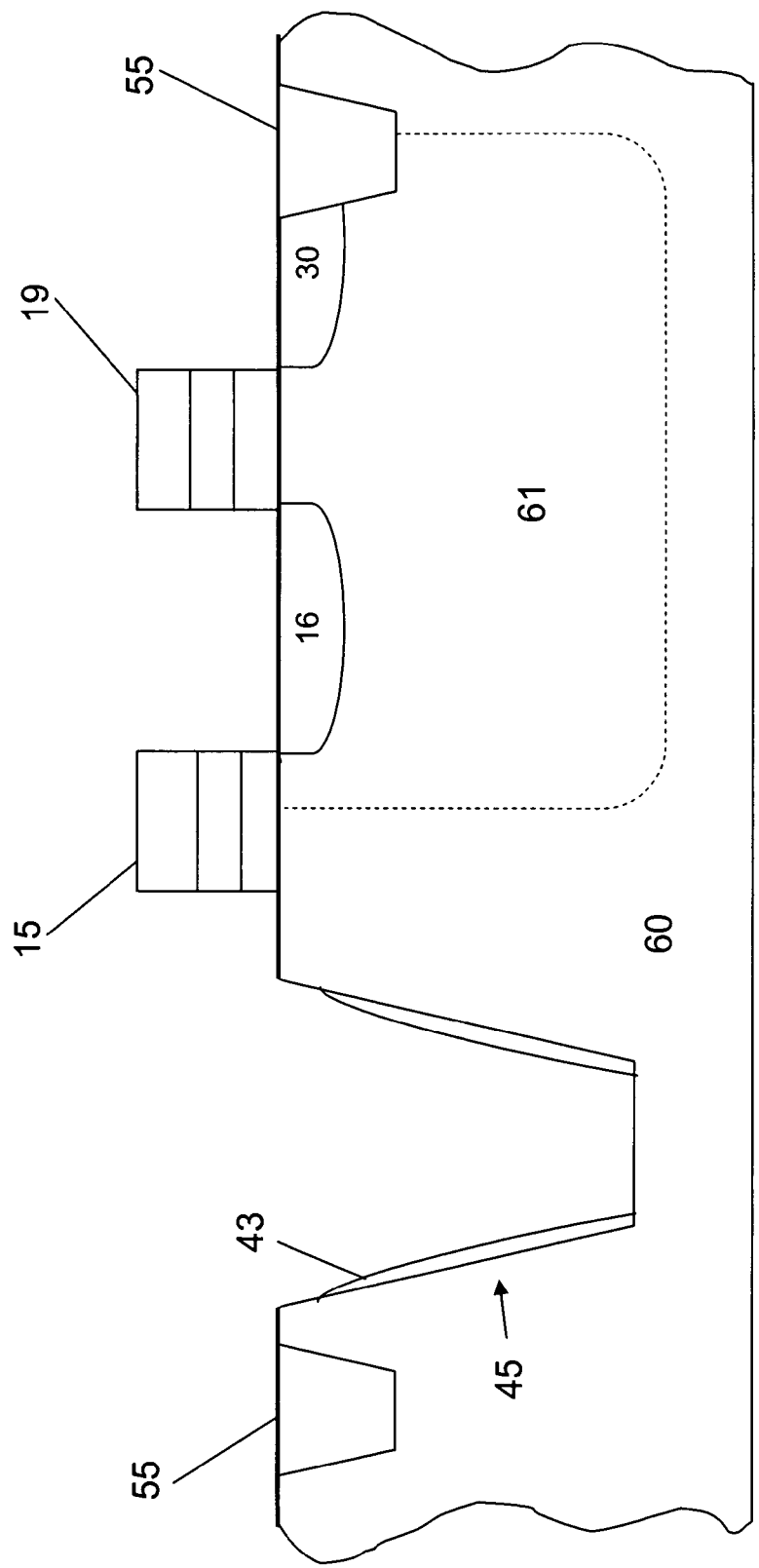

A spacer layer 43 is formed within the trench 45, as illustrated in FIG. 6. The spacer layer 43 may be formed of any suitable material including, for example, nitride, or a thin layer of oxide. Layer 43 is formed over the sides and bottom of trench 45. The bottom portion of layer 43 is then etched to expose the bottom surface of the trench (if layer 43 is not an oxide layer), as depicted in FIG. 7. If layer 43 is a thin oxide layer, then the bottom portion of layer 43 does not need to be exposed. Also, as depicted in FIG. 7, the top portion of layer 43 is etched down to about 200 Å to about 500 Å from the top surface of substrate 60, which creates a slope and exposes and electrically connects polysilicon layer 40 (FIG. 9) to transfer transistor 26.

Figure 8:
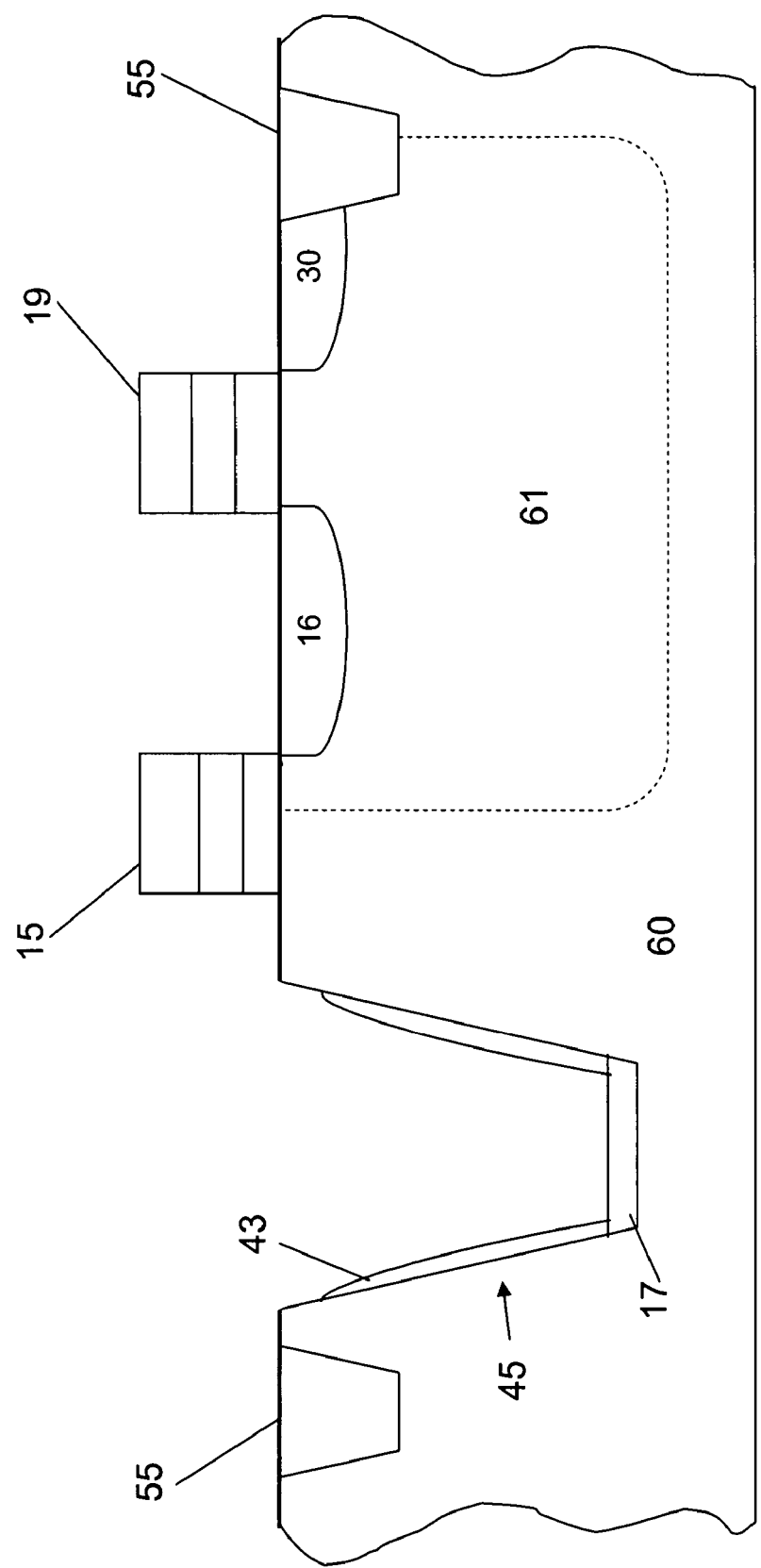
Figure 9:
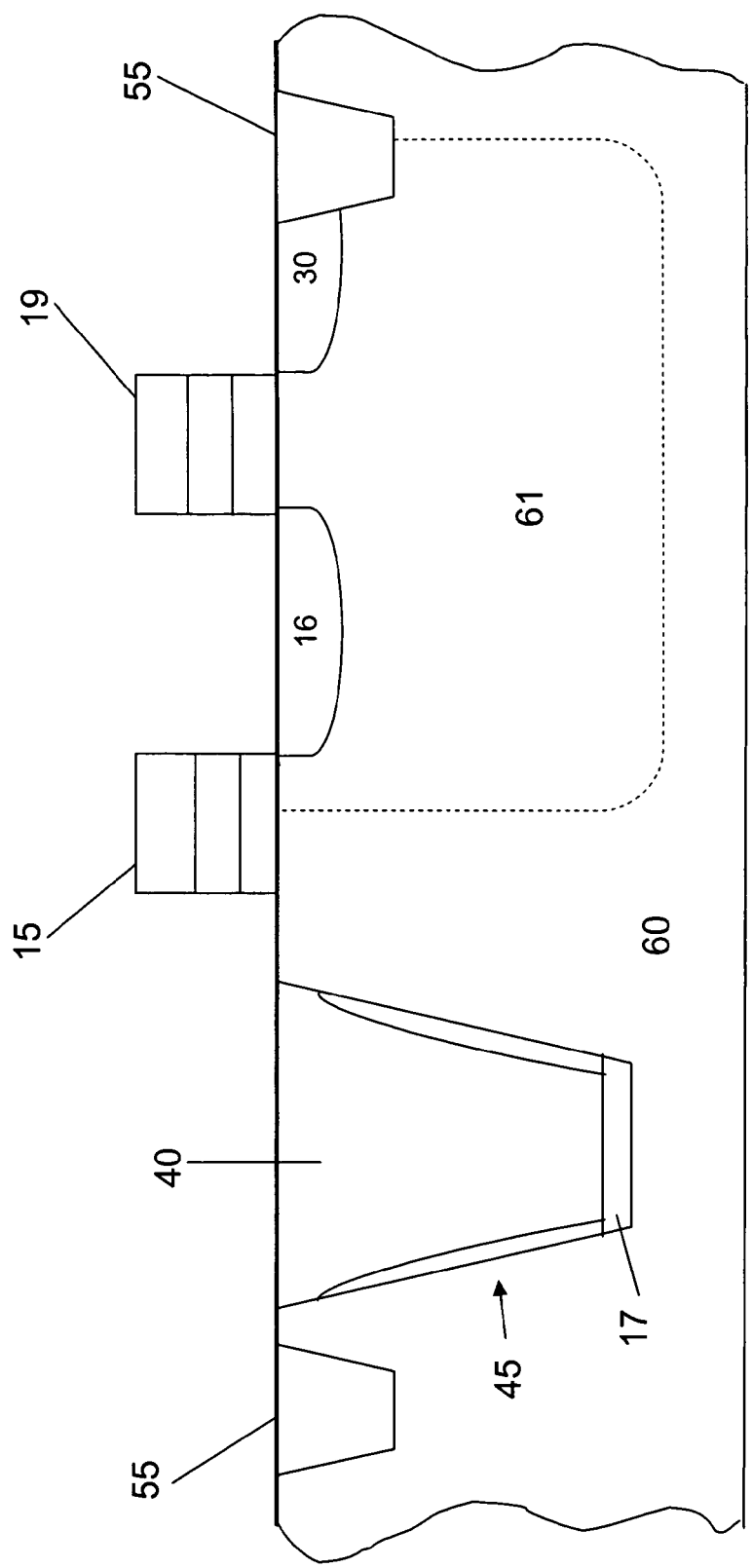

As illustrated in FIG. 8, an oxide layer 17 is grown on the exposed bottom surface of trench 45. The oxide layer 17 has a thickness in the range of about 100 Å to about 300 Å. According to the invention, polysilicon 40 is deposited into the trench 45. The trench is filled to the level of the surface of substrate 60 (FIG. 9). The polysilicon layer 40 may be deposited into the trench 43 by methods known in the art or as described below.

In the illustrated embodiment, the polysilicon layer 40 is a hydrogenated amorphous polysilicon. Leakage levels in amorphous silicon are reduced by increasing the passivation of grain boundaries through hydrogen. As another example, deuteriated amorphous silicon may be used, which also has good passivation characteristics. Yet another exemplary deposition technique employs fluorine incorporated into amorphous silicon after deposition through implantation at a dose of about $1.0 \times 10^{15}/cm^2$ to about $5 \times 10^{15}/cm^2$ at about 5 keV to about 15 keV energies. As another alternative, the polysilicon layer 40 may be formed by chemical vapor deposition (CVD). The oxide layer 17 has a different refractive index and different band gap through the index of the polysilicon layer 40, which, in the operation of the pixel, allows photons to be reflected back upward into the layer 40.

Figure 10:
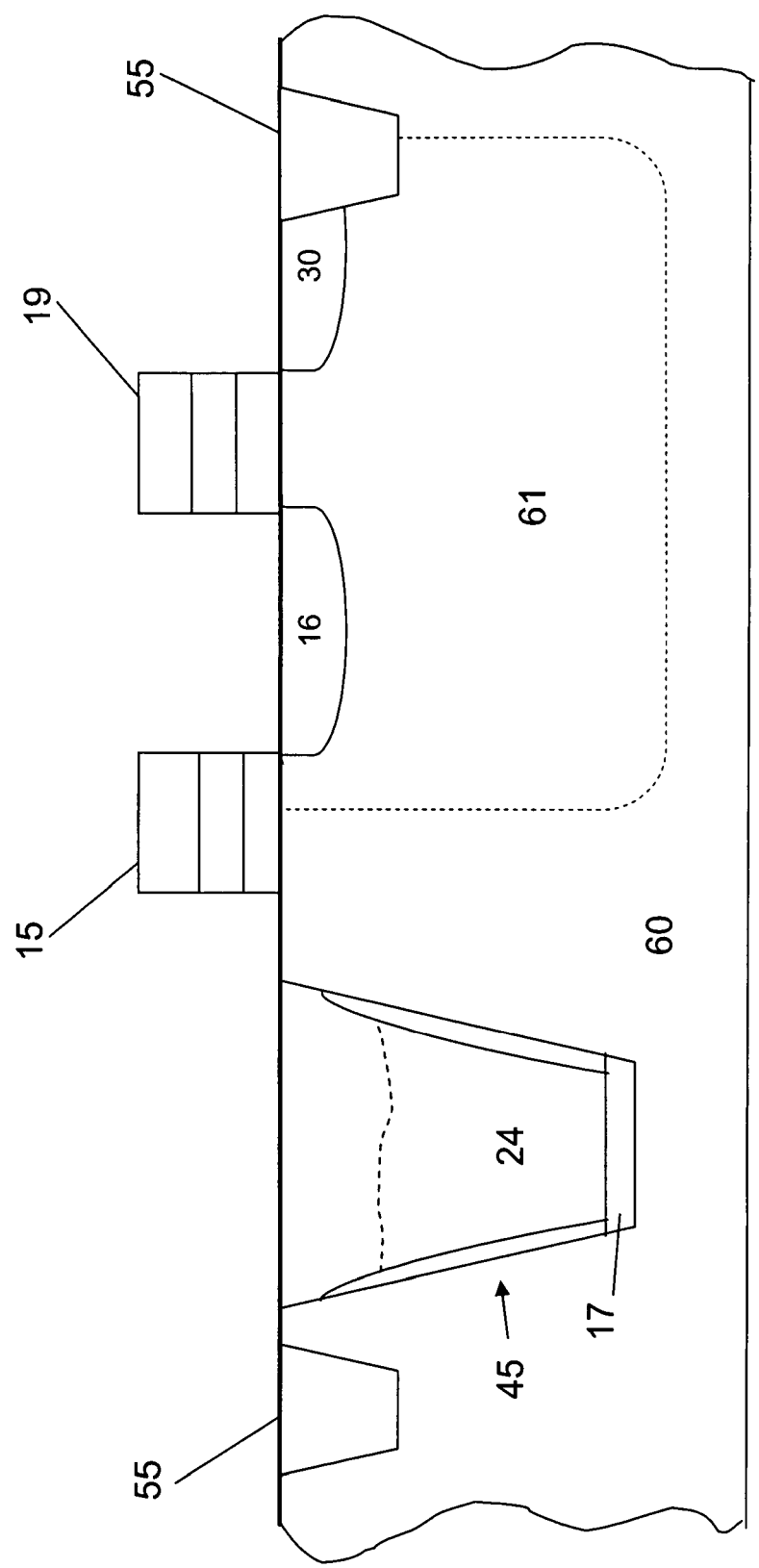
Figure 11:
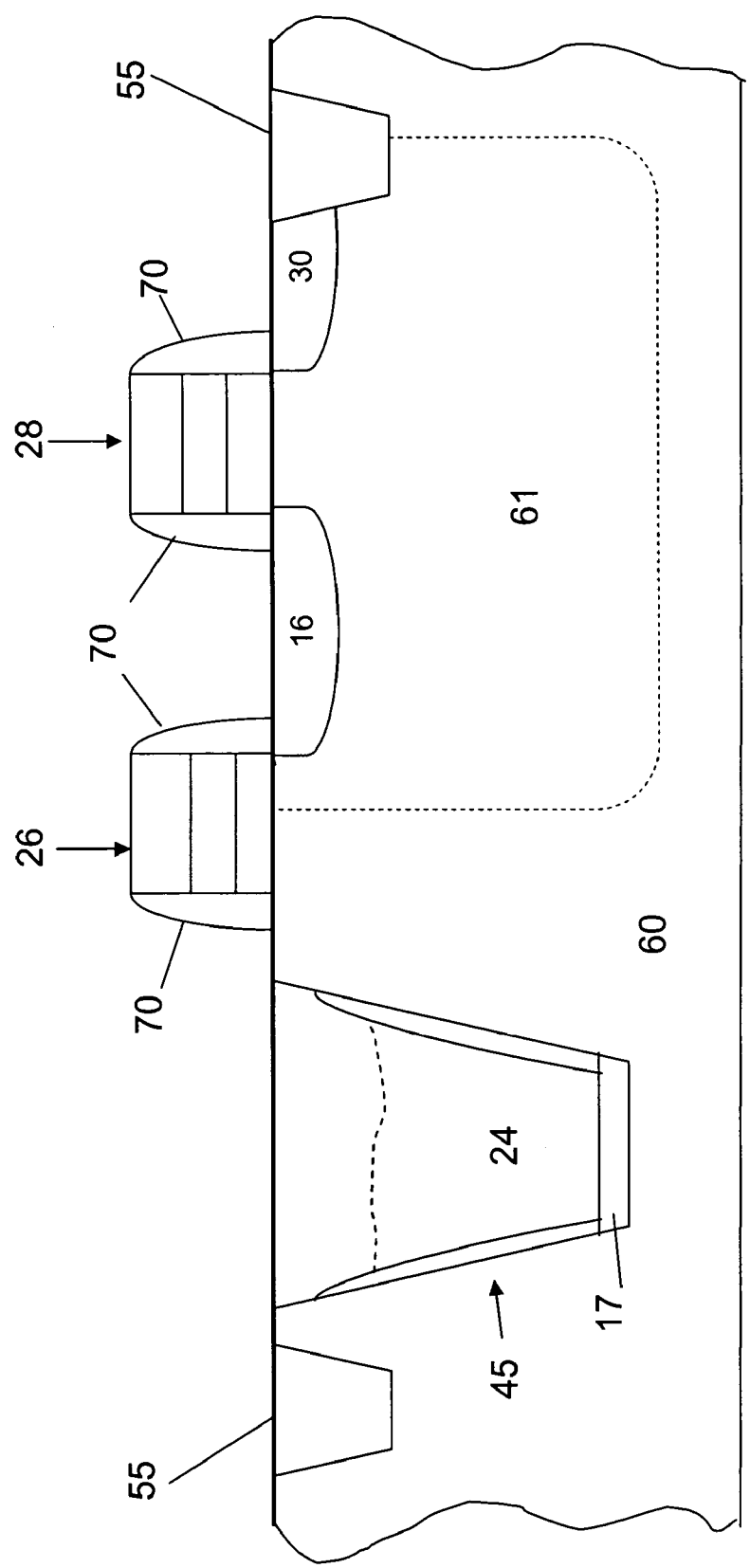
Figure 12:
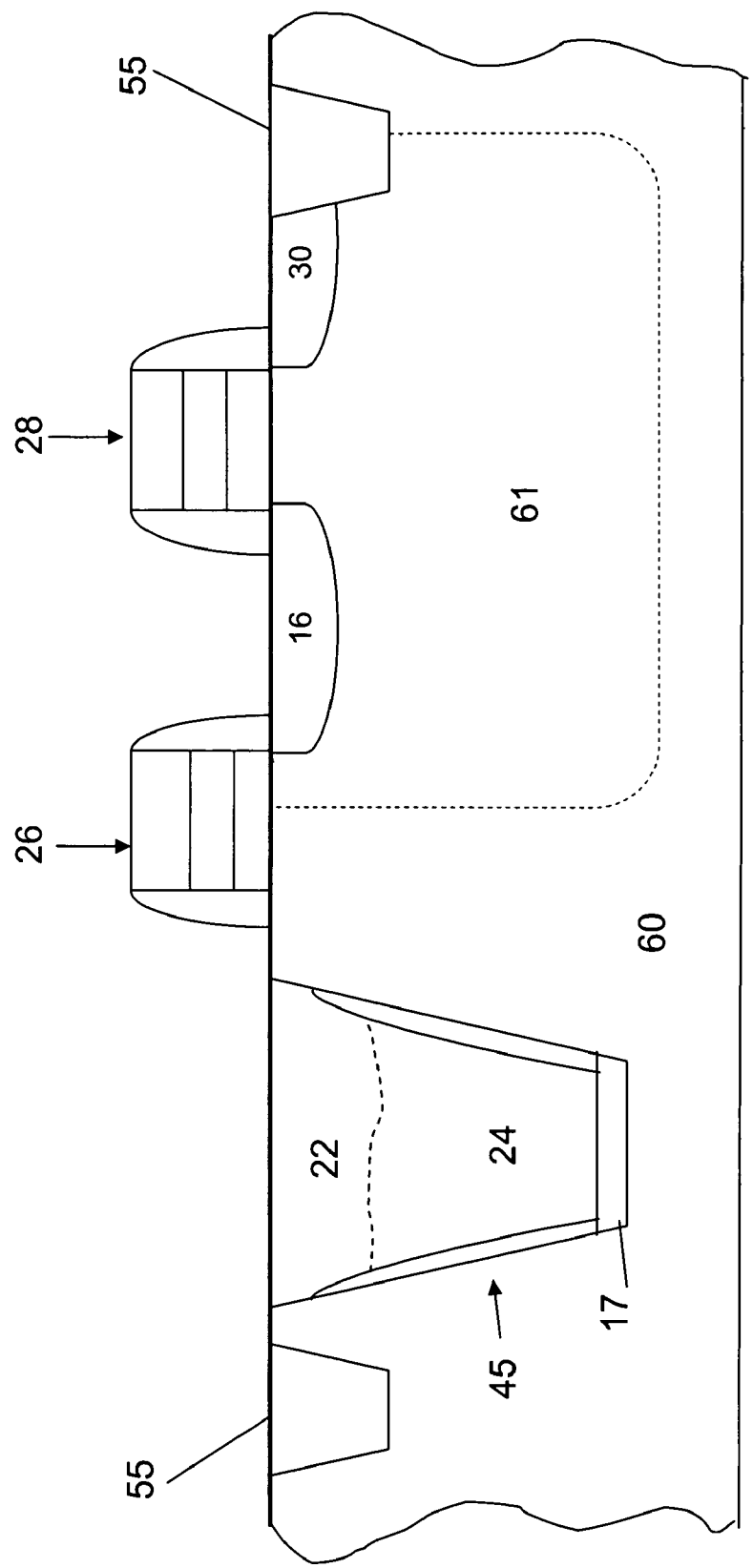
Figure 13:
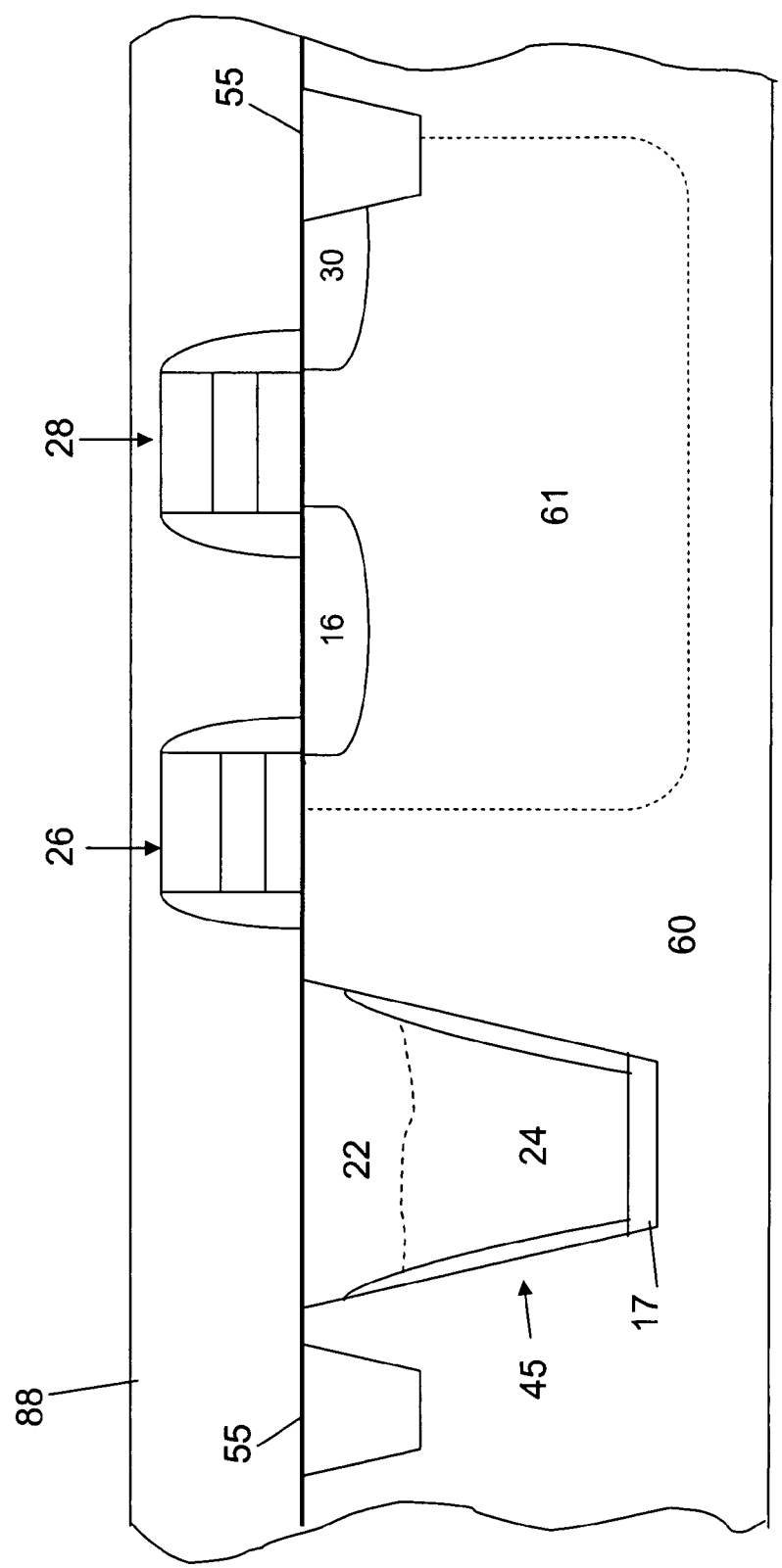

FIG. 10 illustrates a formed region 24 of photodiode 50 (FIG. 2). In this embodiment, the region 24 is an n-type region formed by doping a portion of the polysilicon layer 40. Region 24 is formed by methods known in the art such as for example, ion implantation. As shown in FIG. 11, gate stack sidewall insulators 70 are formed on the sides of the gate stacks 15, 19 (FIG. 10), using conventional techniques, to form transfer and reset transistors 26, 28, with their associated gates. Gate stack sidewall insulators are also formed on other remaining gate stacks (e.g., source follower transistor) but are not shown in FIG. 11. A second region 22 (FIG. 12) of the photodiode 50 may be formed at this time and for exemplary purposes, is a p-type region. A junction diode may be formed in the trench by annealing after region 22 is formed.

The pixel sensor cell is essentially complete at this stage, and conventional processing methods may be used to form insulating, shielding, and metallization layers to connect gate lines and other connections to the pixel sensor cells. For example, the entire surface may be covered with a passivation layer 88 (FIG. 13) of, for example, silicon dioxide, boro-silicate glass (BSG), phosphosilicate glass (PSG), or boro-phospho-silicate glass (BPSG), which is CMP planarized and etched to provide contact holes, which are then metallized to provide contacts. Conventional layers of conductors and insulators may also be used to interconnect the structures and to connect the pixel to peripheral circuitry.

Figure 14:
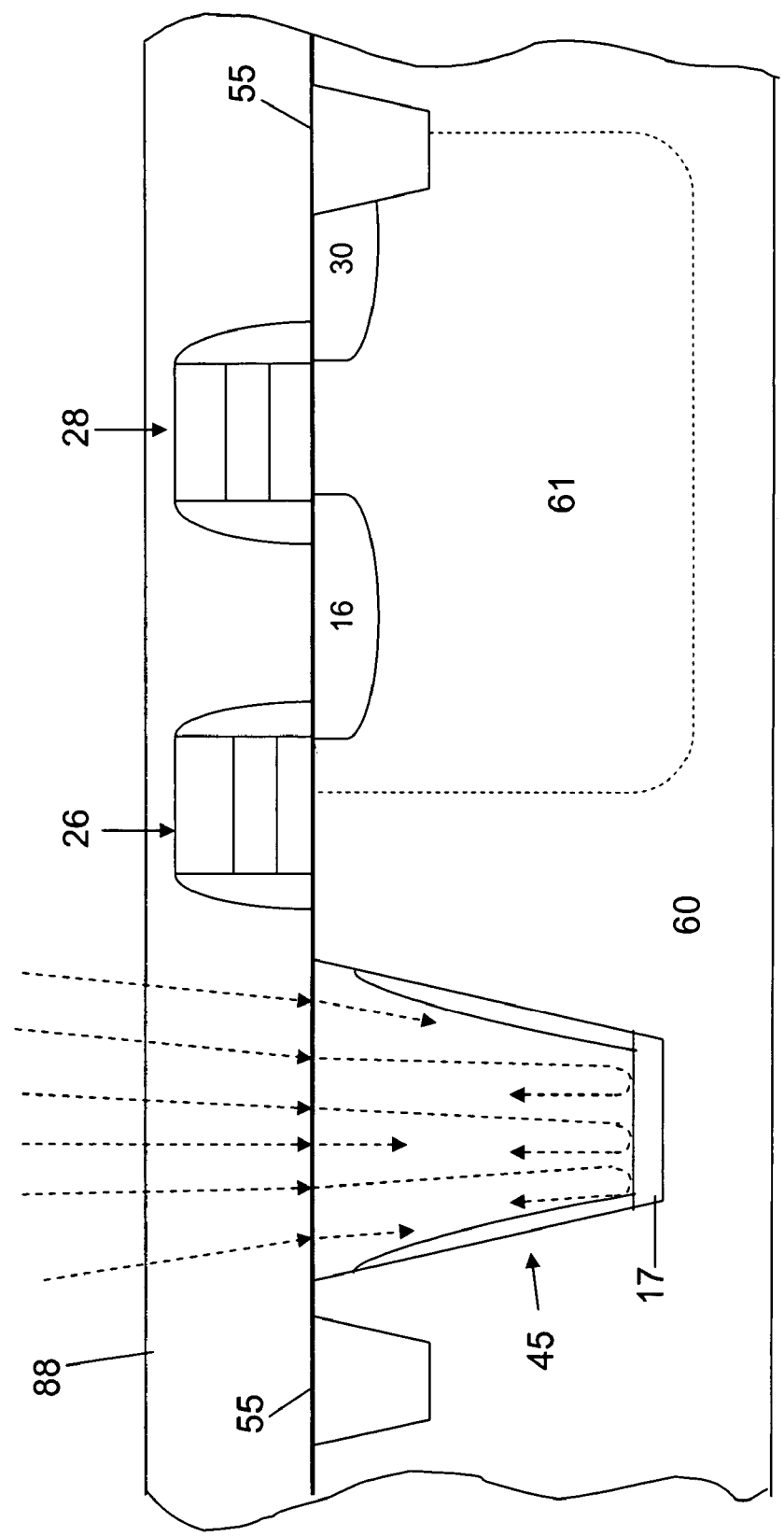

FIG. 14 illustrates that during operation of the pixel incident light is reflected from the bottom layer 17 of the photodiode 50 up toward the surface of substrate 60. When incident light of a longer wavelength (e.g., 650-750 nm or longer) strikes the photodiode 50, the light is reflected away from the substrate instead of being lost through the substrate 60 or to neighboring pixels.

Figure 15:
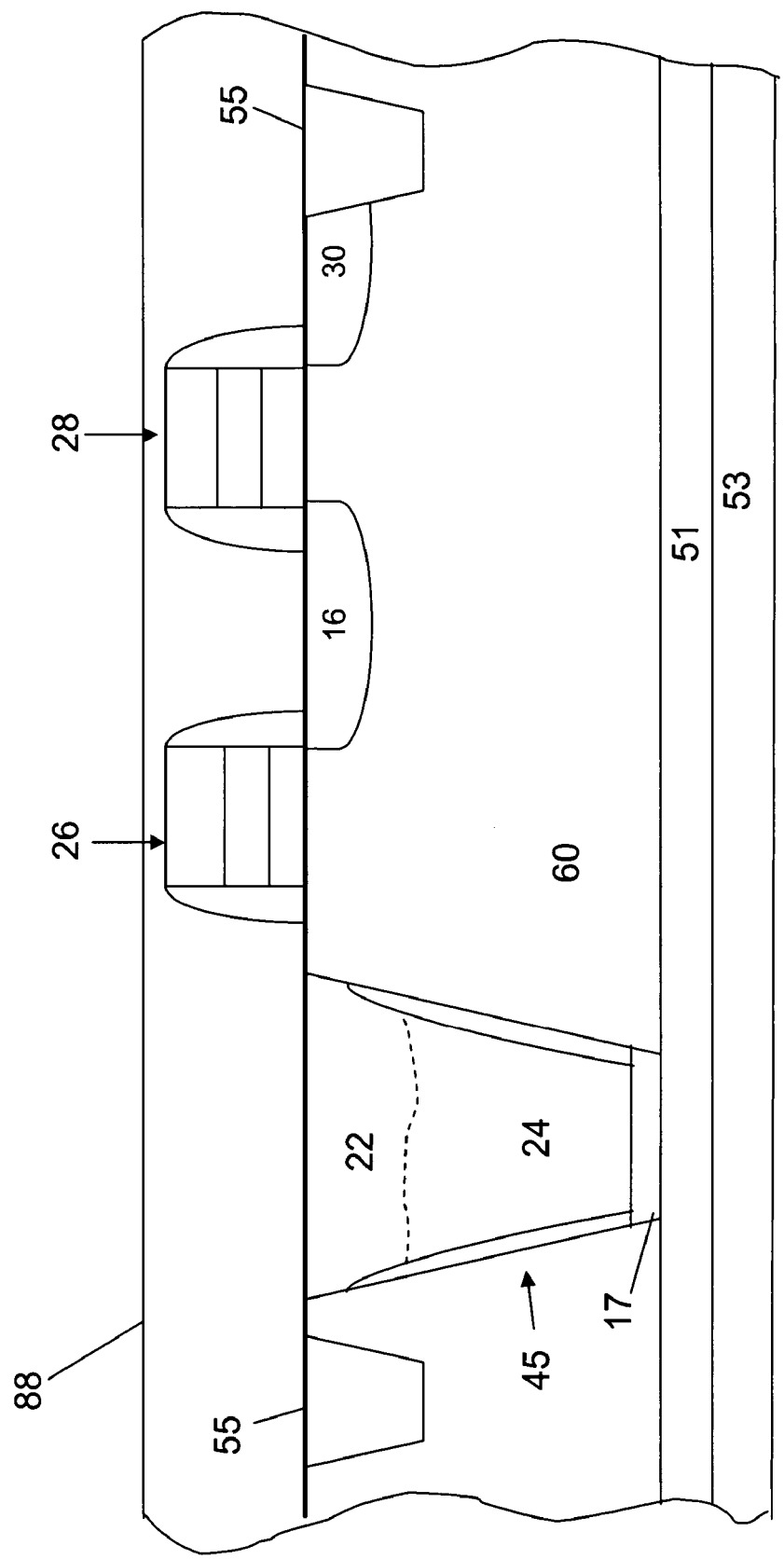
FIG. 15 is a cross-sectional view of a second embodiment of the invention.

FIG. 15 shows another embodiment of the invention which is similar to the embodiment described above in relation to FIGS. 3-14 except that the embodiment of FIG. 15 has an additional insulator layer 51 and silicon layer 53. Layer 51 may be formed of insulator materials used in the art such as oxide to form a silicon on oxide (SOI) pixel. Alternatively, layer 51 may be formed of insulator materials such as sapphire to form a silicon on sapphire (SOS) pixel. The thickness of the insulator layer 51 may be in the range of about 2000 Å to about 5000 Å. The thickness of the silicon layer (substrate 60) may be in the range of about 200 Å to about 2000 Å.

Figure 16:
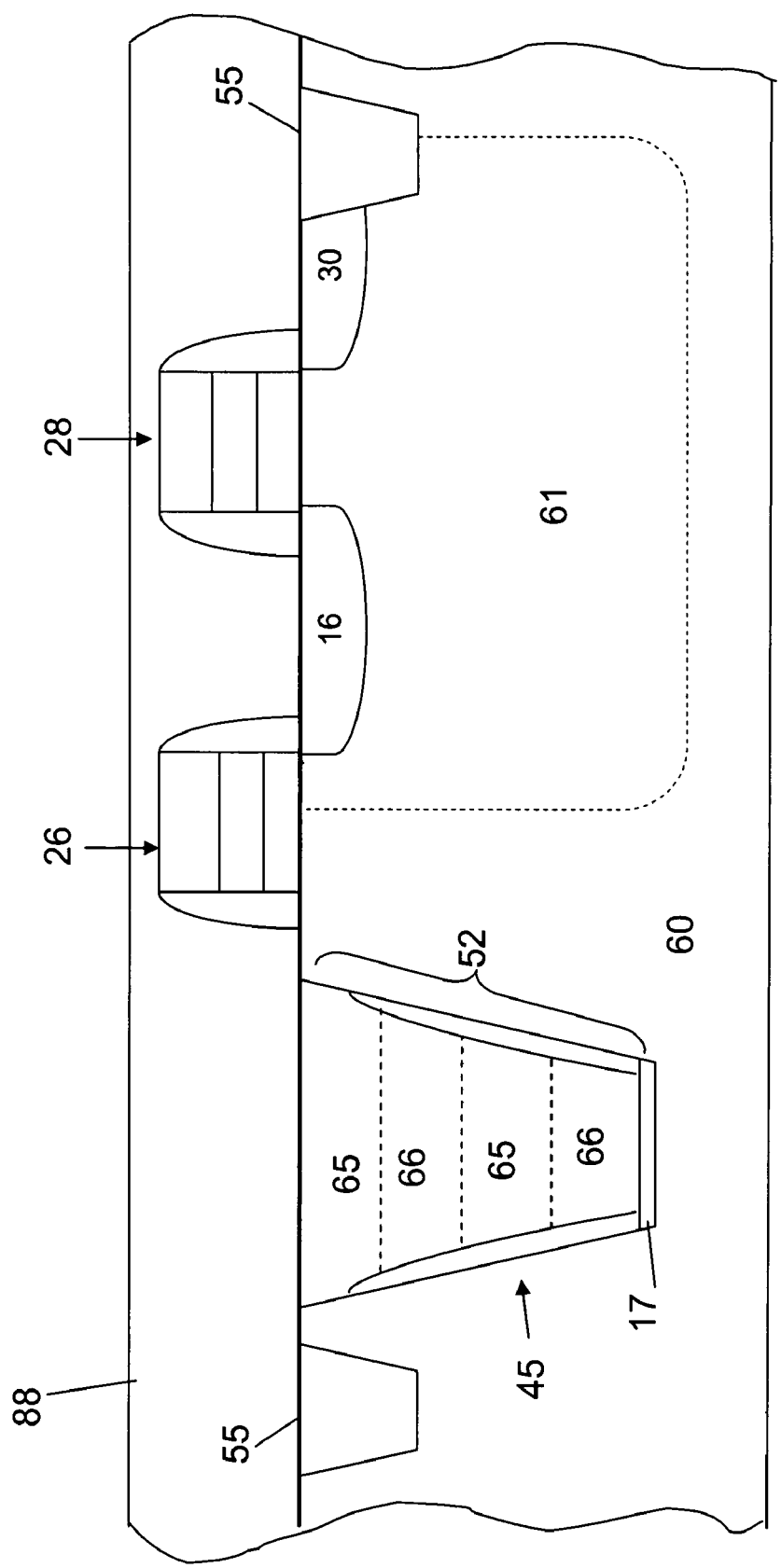
FIG. 16 is a cross-sectional view of a third embodiment of the invention.

Another embodiment of the invention is shown in FIG. 16. In the illustrated embodiment the photodiode 52 contains carrier multiplication layers 65, 66. The embodiment of FIG. 16 is similar to the embodiment described above in relation to FIGS. 3-14 with the exception of the formation of photodiode 52. The embodiment of FIG. 16 employs multiple layers of semiconducting films, rather than two doped regions, as in the embodiment of FIGS. 3-14. By depositing or epitaxially growing alternating layers 65, 66, of semiconducting films inside trench 45, carrier amplification is achieved. In an exemplary embodiment, alternating layers of $Si_xGe_{1-x}$ (where x is a mole fraction of about 0 to about 1.0), are deposited in the trench 45. By changing the mole fraction, the bandgap of the material is changed. For example, where a high bandgap material is followed by a low bandgap material, band off-sets will be created near the interfaces of the layers. When carriers drift through such interfaces, they gain energy due to the offsets and some may undergo an impact ionization (collision with the lattice to create additional electron hole pairs), which leads to carrier amplification.

Figure 17:
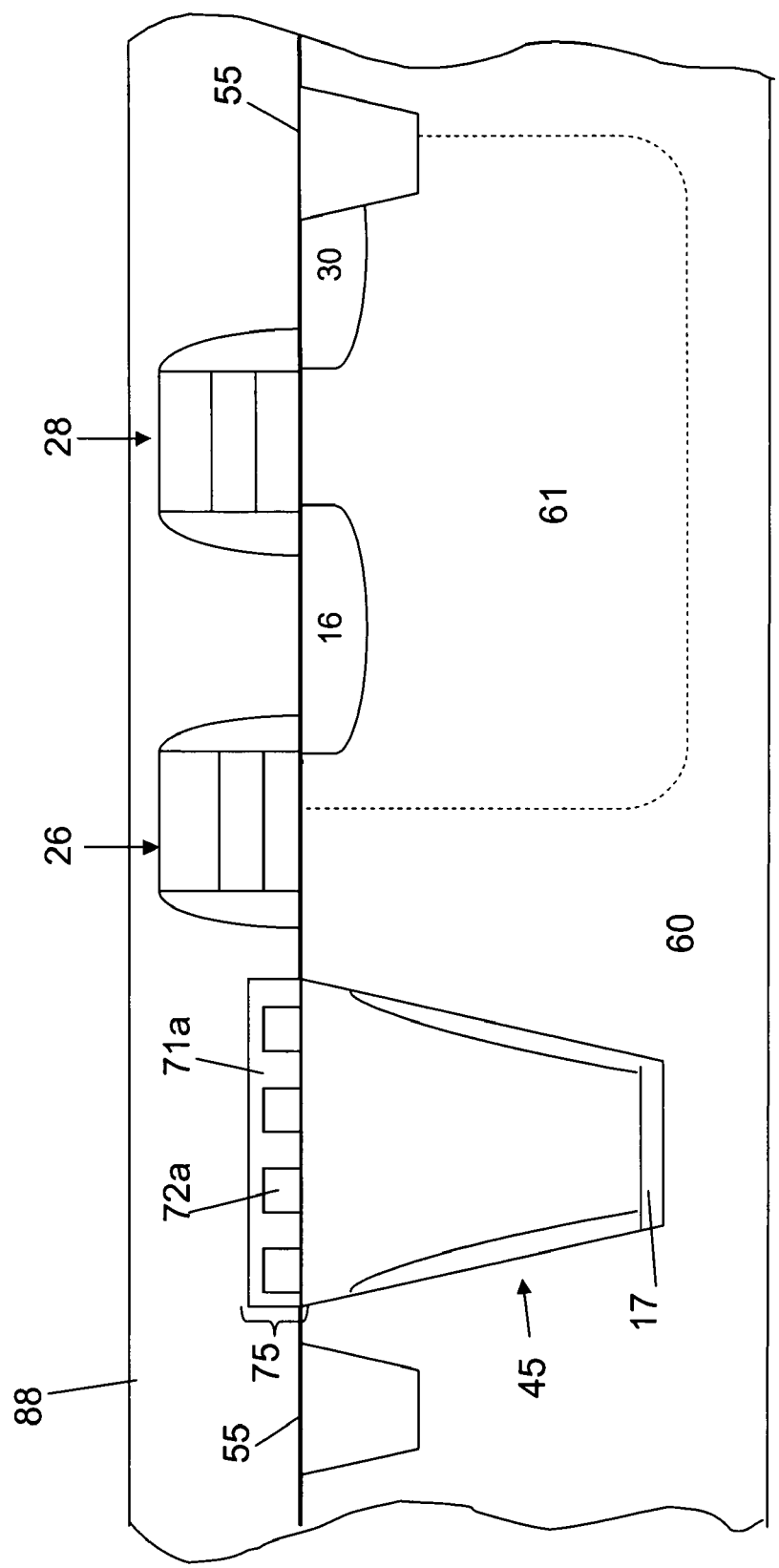
FIG. 17 is a cross-sectional view of a fourth embodiment of the invention.

In another embodiment, shown in FIG. 17, a refractive area 75 is formed over the photodiode 50. Formation of the pixel sensor cell is similar to the embodiment shown in FIGS. 3-14, with the exception of the formation of refractive area 75 having regions 71a, 72a with differing refractive indexes, n1 and n2, respectively. Regions 71a, 72a are dielectric layers and may be selected from the group of $SiO_2$ (refractive index 1.45), plasma enhanced chemical vapor deposited (PECVD) oxide (refractive index 1.460), fluorinated silica glass oxide (FSG) (refractive index 1.435), silicon nitride (refractive index 2.05), high density plasma (HDP) oxide (refractive index 1.47), spin-on-dielectric (SOD) oxide (refractive index 1.3) or carbon doped silicon dioxides (refractive index 1.25 to 1.35, depending on carbon content), to name a few.

Figure 18A:
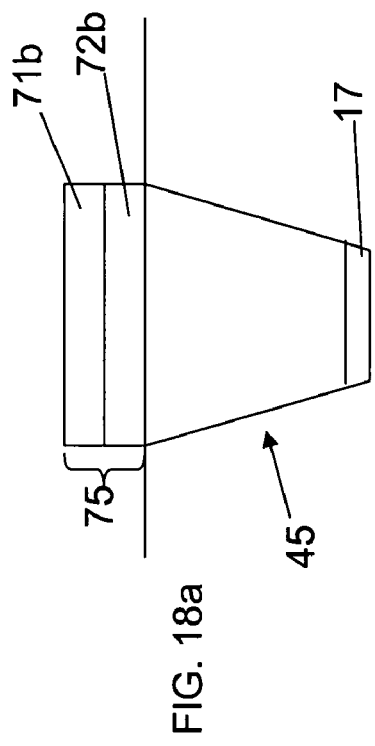
FIGS. 18a-18c illustrate further embodiments of the invention of FIG. 17.
Figure 18B:
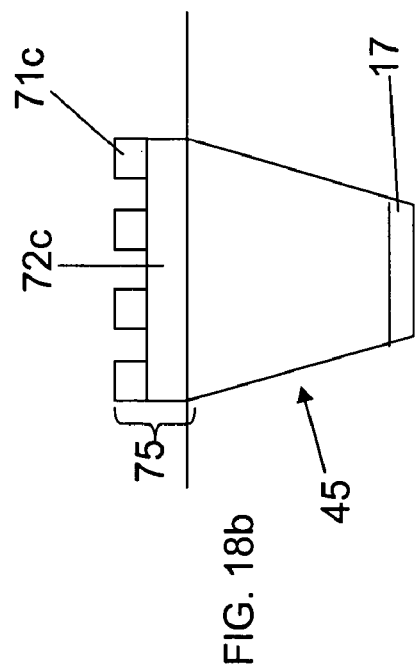
Figure 18C:
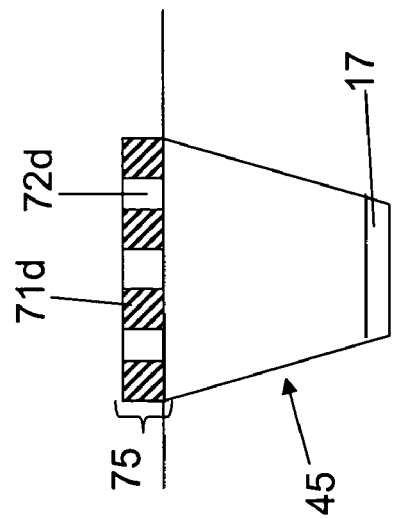

FIGS. 18a-18c show alternative embodiments of refractive area 75, illustrating only a portion of a pixel. Regions 71 and 72 have refractive indexes, n1 and n2, respectively, and are positioned in different configurations over the photodiode 50. FIG. 18a shows the refractive area 75 having a layer 71b positioned over a layer 72b. FIG. 18b depicts an embodiment where region 72c is a continuous layer with a pattern of region 71c formed thereon. FIG. 18c is an illustration of another embodiment where regions 71d and 72d are located adjacent to one another in an alternating pattern.

Alternate high and low-refractive index layers offer better optical reflection characteristics for the top mirror. Creating a pattern allows incoming photons to pass through while bottom reflected photons get top reflected by another material that has a different refractive index, which increases quantum efficiency. Creating a pattern using dielectric layers might allow filtering wavelengths of interest. This depends on the pattern's spacing and pitch, which can be defined by lithograpy. This embodiment is useful for special purpose sensors, for example infrared and UV sensors.

Figure 19:
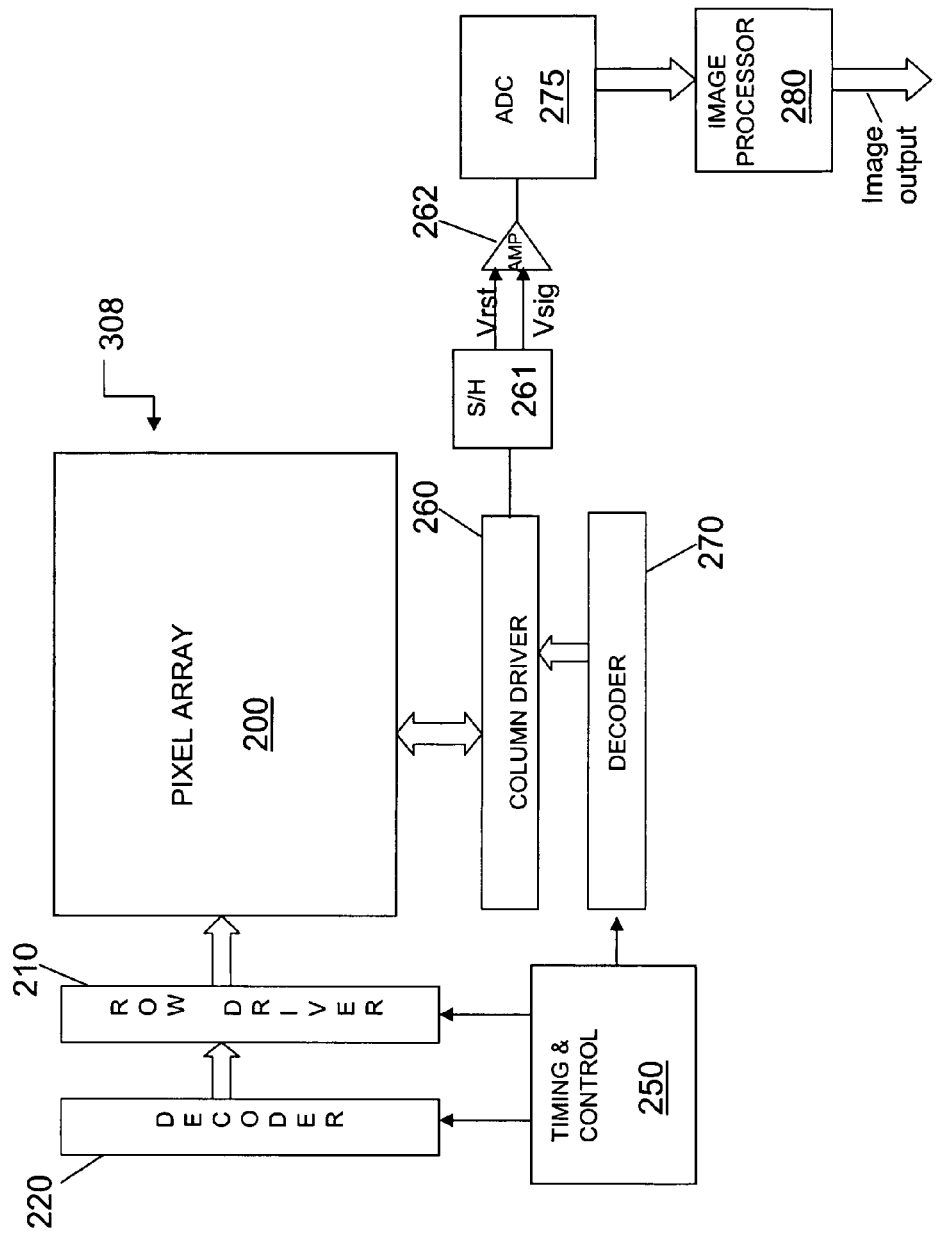
FIG. 19 is a block diagram of an image sensor according to an embodiment of the invention.

FIG. 19 illustrates a block diagram of an exemplary imaging device 708 that may be used in accordance with an embodiment of the invention. Imager 708 has a pixel array 200 with each pixel cell being constructed as described above. The row lines are selectively activated by a row driver 210 in response to row address decoder 220. A column driver 260 and column address decoder 270 are also included. The imager is operated by the timing and control circuit 250, which controls address decoders 220, 270. The control circuit 250 also controls the row and column driver circuitry 210, 260. A sample and hold circuit 261 associated with the column device 260 reads a pixel reset signal ($V_{rst}$) and a pixel image signal ($V_{sig}$) for selected pixels. A differential signal ($V_{rst-Vsig}$) is produced by differential amplifier 262 for each pixel which is digitized by analog to digital converter 275 (ADC). The analog to digital converter 275 supplies the digitized pixel signals to an image processor 280 which forms a digital image.

Figure 20:
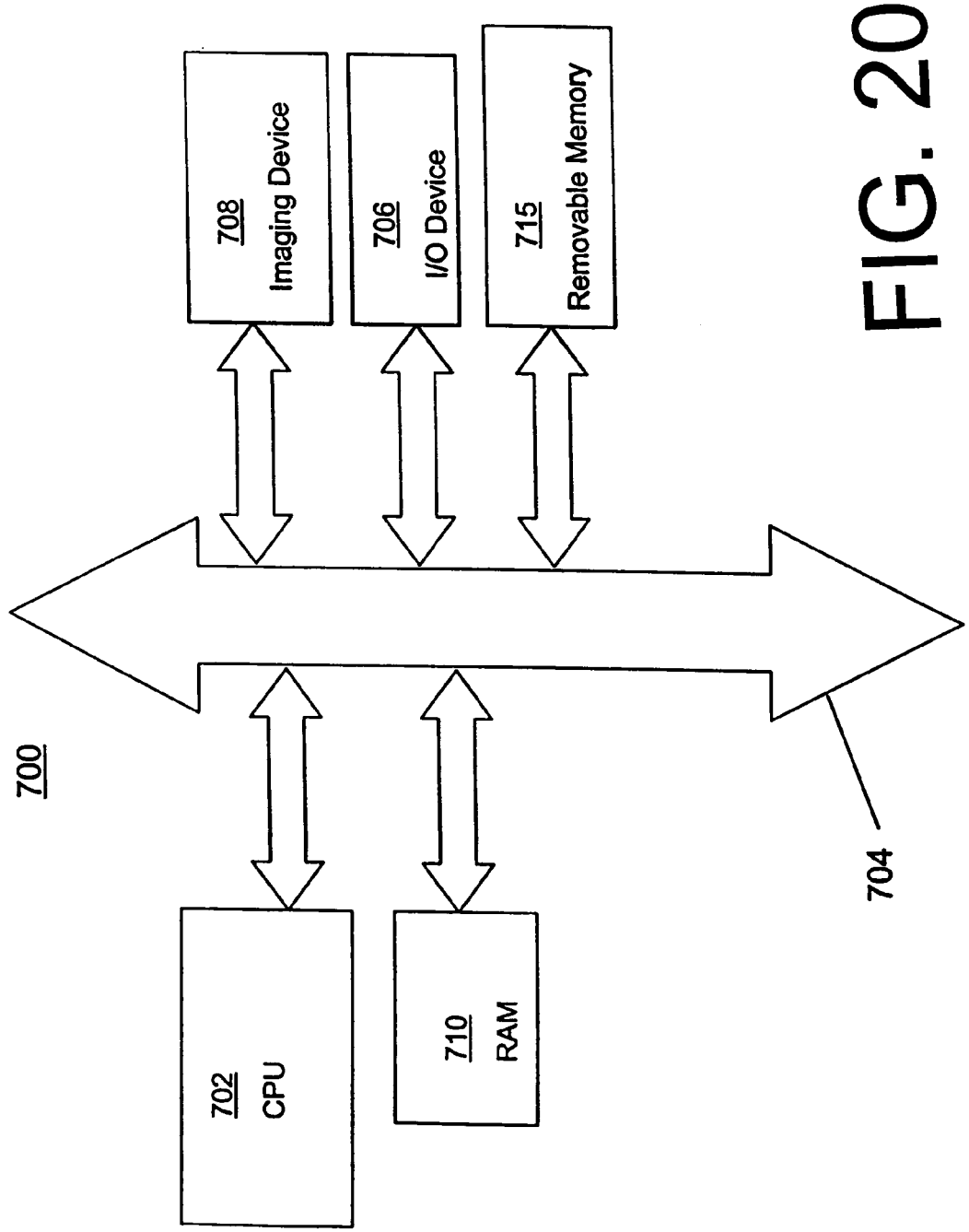
FIG. 20 is a block diagram of a processing system according to an embodiment of the invention.

FIG. 20 shows system 700, a typical processor system modified to include an imaging device 708 constructed in accordance with an embodiment of the invention. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

The invention claimed is:

1. An image sensor comprising:
   a substrate;
   a trench formed in the substrate; and
   a photoconversion device in said trench, said photoconversion device having an active region for absorbing incident light and converting the light to charge and comprising at least one material from the group consisting of: hydrogenated polysilicon, deuteriated polysilicon, and fluorinated polysilicon;
   a layer in said trench, the layer having an index of refraction such that at least a portion of the incident light striking said layer is reflected toward the active region of said photoconversion device.

2. An image sensor comprising:
   a substrate;
   a trench formed in the substrate; and
   a photoconversion device formed at least partially within said trench, said photoconversion device having an active region for absorbing incident light and converting the light to charge and comprising deuteriated polysilicon, said trench having a layer below said active region with an index of refraction such that at least a portion of the incident light striking said layer is reflected toward the active region of said photoconversion device.

3. An image sensor comprising:
   a substrate;
   a trench formed in the substrate; and
   a photoconversion device formed at least partially within said trench, said photoconversion device having an active region for absorbing incident light and converting the light to charge and comprising fluorinated polysilicon, said trench having a layer below said active region with an index of refraction such that at least a portion of the incident light striking said layer is reflected toward the active region of said photoconversion device.

4. An image sensor comprising:
   a substrate;
   a trench formed in the substrate; and
   a photoconversion device formed at least partially within said trench, said photoconversion device having an active region for absorbing incident light and converting the light to charge and comprising hydrogenated polysilicon, said trench having a layer below said active region with an index of refraction such that at least a portion of the incident light striking said layer is reflected toward the active region of said photoconversion device.

5. The image sensor according to claim 1, wherein said photoconversion device comprises polysilicon.

6. The image sensor according to claim 1, wherein said photoconversion device comprises polysilicon doped with differing dopants to form a p-n junction.

7. The image sensor according to claim 1, wherein said layer within said trench is formed of oxide.

8. The image sensor according to claim 1, wherein said trench is formed to a depth in the range of about 0.5 μm to about 10 μm.

9. The image sensor according to claim 1, wherein said trench has sidewalls.

10. The image sensor according to claim 9, wherein said sidewalls comprise nitride.

11. The image sensor according to claim 9, wherein said sidewalls comprise an oxide layer.

12. The image sensor according to claim 1, further comprising an insulator layer beneath said substrate.

13. The image sensor according to claim 12, wherein said insulator layer comprises an oxide.

14. The image sensor according to claim 12, wherein said insulator layer comprises sapphire.

* * * * *

UNITED STATES PATENT AND TRADEMARK OFFICE
CERTIFICATE OF CORRECTION

PATENT NO. : 7,279,764 B2  
APPLICATION NO. : 10/856935  
DATED : October 9, 2007  
INVENTOR(S) : Mouli Page 1 of 1

It is certified that error appears in the above-identified patent and that said Letters Patent is hereby corrected as shown below:

In column 8, line 51, in Claim 5, delete "claim 1," and insert -- claim 4, --, therefor.

In column 8, line 53, in Claim 6, delete "claim 1," and insert -- claim 4, --, therefor.

In column 8, line 56, in Claim 7, delete "claim 1," and insert -- claim 4, --, therefor.

In column 8, line 58, in Claim 8, delete "claim 1," and insert -- claim 4, --, therefor.

In column 8, line 62, in Claim 9, delete "claim 1," and insert -- claim 4, --, therefor.

In column 9, line 1, in Claim 12, delete "claim 1," and insert -- claim 4, --, therefor.

Signed and Sealed this

Eighteenth Day of December, 2007

JON W. DUDAS  
*Director of the United States Patent and Trademark Office*